United States Patent
Lim

(10) Patent No.: US 6,919,752 B2
(45) Date of Patent: Jul. 19, 2005

(54) LEVEL SHIFTER AND LATCH WITH THE SAME BUILT IN

(75) Inventor: Kyoung Moon Lim, Kwangmyung-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/464,481

(22) Filed: Jun. 19, 2003

(65) Prior Publication Data

US 2004/0100318 A1 May 27, 2004

(30) Foreign Application Priority Data

Nov. 27, 2002 (KR) .................................. 10-2002-0074364

(51) Int. Cl.[7] .............................................. H03L 5/00
(52) U.S. Cl. ...................................................... 327/333
(58) Field of Search ................................ 327/199, 208, 327/210, 214, 306, 309–310, 312, 318–319, 321, 323, 328, 333; 326/68, 80–81

(56) References Cited

U.S. PATENT DOCUMENTS

| | | | | |
|---|---|---|---|---|
| 6,236,256 B1 | * | 5/2001 | Brownlow et al. | 327/333 |
| 6,265,896 B1 | * | 7/2001 | Podlesny et al. | 326/80 |
| 6,351,173 B1 | * | 2/2002 | Ovens et al. | 327/333 |
| 6,545,519 B1 | * | 4/2003 | Carballo | 327/211 |
| 6,600,357 B1 | * | 7/2003 | Kirihara | 327/333 |
| 6,717,452 B2 | * | 4/2004 | Carpenter et al. | 327/333 |

* cited by examiner

Primary Examiner—My-Trang Nu Ton
(74) Attorney, Agent, or Firm—McKenna Long & Aldridge LLP

(57) ABSTRACT

A level shifter includes a controller for selectively using a first power supply or a second power supply in accordance with an input voltage to apply a voltage to a first node, wherein, the level of the applied voltage is opposite the level of the input voltage; and an output part for selectively using the first power supply, a second power supply, or a third power supply in accordance with the voltage at the first node and for applying an output voltage, wherein the level of the output voltage is opposite the level of the voltage at the first node.

28 Claims, 9 Drawing Sheets

LEVEL SHIFTER AND LATCH WITH THE SAME BUILT IN

This application claims the benefit of Korean Patent Application No. 2002-74364, filed on Nov. 27, 2002, which is hereby incorporated by reference for all purposes as if fully set forth herein.

BACKGROUND OF THE INVENTION

1. Field of the Invention

The present invention relates to a level shifter circuit for shifting a voltage level of an inputted signal, and more particularly to a level shifter circuit capable of being fabricated in a display panel having polycrystalline silicon thin film transistors and a built-in latch circuit.

2. Description of the Related Art

Flat panel display devices such as liquid crystal displays (LCDs), electro-luminescence (EL) display devices, plasma display panels (PDPs), and the like, are being used to replace cathode ray tubes (CRTs). Of the aforementioned flat panel display devices, LCDs alter transmittance of light generated by a light source using dielectric anisotropy of liquid crystals within electric fields to display pictures. EL display devices radiate phosphorus material by re-combining electrons with holes to display pictures.

All LCD and EL display devices use thin film transistors (TFTs) as switching devices within individual picture elements to provide active matrix driving systems. The semiconductor layer of TFTs typically is either amorphous silicon or polycrystalline silicon. Accordingly, TFTs may be classified as either polycrystalline silicon type TFTs or amorphous silicon type TFTs.

Display devices fabricated using amorphous silicon type TFTs have a relatively low pixel density because amorphous silicon has a relatively small charge mobility and low response speed. Moreover, use of amorphous silicon type TFTs in flat panel displays is disadvantageous because fabricating gate and data drivers out of amorphous silicon tends to be expensive and the time required to fabricate LCDs using amorphous silicon type TFTs tends to be lengthy due to their need to be manufactured separately from, and attached to a liquid crystal display panel.

Display devices fabricated using polycrystalline silicon type TFTs have a relatively high pixel density because polycrystalline silicon has a relatively high charge mobility. Moreover, use of polycrystalline silicon type TFTs in flat panel display devices is advantageous because they decrease the manufacturing cost of the gate and data drivers due to their ability to be formed with driving circuits built in the flat display panel. Accordingly, flat panel displays (e.g., LCDs, EL display devices, etc.) employing polycrystalline silicon TFTs will now be discussed in greater detail below.

FIG. 1 illustrates a schematic view of a related art liquid crystal display panel employing polycrystalline silicon TFTs.

Referring to FIG. 1, the LCD includes a liquid crystal display panel 10 having a picture display area 16, a data driver 12 for driving data lines DL of the picture display area 16, and a gate driver 14 for driving gate lines GL of the picture display are 16.

The picture display part 16 includes pixels arranged in a matrix pattern, wherein the pixels include liquid crystal cells LC to display pictures. Each liquid crystal cell LC includes a switching device such as a polycrystalline silicon type TFT arranged at a crossing of a gate line GL and a corresponding data line DL. As polycrystalline silicon has an electric charge mobility roughly 100 times greater than the electric charge mobility of amorphous silicon, liquid crystal cells in the LCD are driven in a point-sequence manner. The TFTs respond to scanning pulses applied to the gate lines GL to charge video signals (i.e., pixel signals), applied to data lines DL, into a respective liquid crystal cell LC. Thus, light transmittance characteristics of liquid crystal cells LC are controlled via the charged pixel signals.

The gate driver 14 shifts a start pulse inputted from an external timing controller (not shown) to generate a shift pulse, level-shifts the shift pulse, and applies the level shifted shift pulse to the gate line GL as a scanning pulse. Accordingly, the gate driver 14 includes a shift register for shifting the start pulse and also includes a level shifter for level shifting the shifted start pulse to for applying the level shifted pulse to the gate line GL as a scanning pulse. For example, the level shifter may shift the voltage level of a shift pulse having a swing voltage of about 10V such that it has a swing width of about 18V. Subsequently, the level shifter outputs the level shifted shift pulse as a scanning pulse.

The data driver 12 converts pixel data inputted from an external timing controller (not shown) into analog pixel signals and applies the analog pixel signals to the data lines DL. As shown in FIG. 2, the data driver 12 includes a shift register 22 for applying a sequential sampling signal, first and second latch arrays 26 and 28, respectively, for responding to a sampling signal to latch and output an inputted pixel data, and a digital to analog converter (DAC) array 32 for converting digital pixel data outputted from the second latch array 28 into analog pixel signals.

The shift register 22 sequentially shifts a source start pulse SSP inputted from the external timing controller in response to a clock signal CLK and outputs the shifted source start pulse SSP as a sampling signal. The first latch array 26 responds to a sampling signal outputted by the shift register 22 to sequentially sample and latch a predetermined number of bits of pixel data outputted from the timing controller and to output the latched pixel data. Accordingly, when 'k' pixel data is to be latched, the first latch array 26 includes k latches. Each of the k latches is of a size that corresponds to a bit number of pixel data (e.g., 3 bits or 6 bits). The second latch array 28 latches pixel data outputted by the first latch array 26 and outputs the latched pixel data in response to a source output enable signal SOE outputted by the timing controller. The driving voltage level of the source output enable signal SOE is level-shifted to a predetermined driving voltage level via the level shifter 30. The level-shifted driving voltage is then applied to the second latch array 28.

The DAC array 32 converts pixel data outputted by the second latch array 32 into analog pixel signals using an external gamma voltage source (not shown). The converted pixel signals are then applied to the data lines DL of the picture display area 16. The DAC array 32 converts positive or negative pixel signals in response to polarity control signals outputted by the timing controller (not shown).

In the liquid crystal display panel employing polycrystalline silicon TFTs, the gate and drivers 14 and 12, respectively, require inputted signals having a swing width greater than 10V in order to drive the picture display area 16. Accordingly, signals (e.g., control signals CLK and SSP and pixel data) applied to elements having a relatively high operation frequency (e.g., shift register 22 and first latch array 26) are directly applied from the external timing controller such that they have a swing width greater than about 10V. However, signals (e.g., source output enable signal SOE) applied to elements having a relatively low operation frequency (e.g., second latch array 28) are outputted from the external timing controller having a relatively low swing width of less than about 5V and are level-shifted via an internal level shifter 30 such that they has a swing width of greater than 10V. Accordingly, the timing controller must be fabricated using high voltage ICs to apply signals having a swing width of greater than 10V and must further be supplied with a high voltage of greater than 10V. Because of these aforementioned requirements, power consumption of the device is deleteriously increased.

In order to overcome the disadvantageous increase in power consumption, a level shifter may be built into the liquid crystal display panel to level-shift and supply high frequency input signals. For example, the following level shifter may be either included within the shift register 22 or located at the pre-stage of the first latch array 26 in the data driver 12 shown in FIG. 2. The aforementioned level shifter could level shift a sampling signal or pixel data having a frequency within several MHz range.

Referring to FIG. 3, a related art level shifter includes a first PMOS transistor MPT1 and a first NMOS transistor MNT1 having gate terminals that are commonly connected to an input voltage (VIN) line, wherein the first PMOS transistor MPT1 and a first NMOS transistor MNT1 are connected in series between a first power supply (VDD) input line and a third power supply (VSS2) input line; a second PMOS transistor MPT2 and a second NMOS transistor MNT2 having gate terminals that are commonly connected to a first node N1 located between the first PMOS transistor MPT1 and the first NMOS transistor MNT1, wherein the second PMOS transistor MPT2 and a second NMOS transistor MNT2 are connected in series between the first power supply (VDD) input line and the third power supply (VSS2) input line; a third PMOS transistor MPT3 having a gate terminal connected to a second node N2 located between the second PMOS transistor MPT2 and the second NMOS transistor MNT2, wherein the third PMOS transistor MPT3 is connected between the first power supply (VDD) input line and a third node N3; a third NMOS transistor MNT3 having a gate terminal connected to a fourth node N4 as an output node, wherein the third NMOS transistor MNT3 is connected between the third node N3 and a second power supply (VSS1) input line; a fourth PMOS transistor MPT4 having a gate terminal connected to the first node N1, wherein the fourth PMOS transistor MPT4 is connected between the first power supply (VDD) input line and the fourth node N4; and a fourth NMOS transistor MNT4 having a gate terminal connected to the third node N3, wherein the fourth NMOS transistor MNT4 is connected between the fourth node N4 and the second power supply (VSS1) input line. The level shifter shown in FIG. 3 further includes two inverters INV1 and INV2 connected in series to the fourth node N4. Inverters INV1 and INV2 are commonly connected to the first and second power supply VDD and VSS1.

The aforementioned level shifter circuit outputs an output pulse voltage having a swing width of −10V to 10V, assuming the pulse voltage swings +10V with respect to the first power supply VDD, −10V with respect to the second power supply VSS1, −4V with respect to the third power supply VSS2, and 0V to +5V with respect to an input voltage.

When a first low-level voltage of 0V is inputted to the input voltage (VIN) line, the first PMOS transistor MPT1 is turned on and charges a first high-level voltage of 10V, supplied from the first power supply VDD, into the first node N1. The first high-level voltage of 10V, charged into the first node N1, turns on the second NMOS transistor MNT2 which, in turn, charges a second low-level voltage of −4V, supplied from the third power supply VSS2, into the second node N2. The second low-level voltage of −4V, charged into the second node N2, turns on the third PMOS transistor MPT3 which, in turn, charges a second high level voltage of 10V, supplied from the first power supply VDD, into the third node N3. The second high-level voltage of 10V, charged into the third node N3, turns on the fourth NMOS transistor MNT4 which, in turn, charges a third low-level voltage of −10V, supplied from the second power supply VSS1, into the fourth node N4 as an output node. The second high-level voltage of 10V, charged into the first node N1, turns off the fourth PMOS transistor MPT4. Accordingly, the third low-level voltage of −10V, charged into the fourth node N4, is applied as an output voltage VOUT via the first and second inverters INV1 and INV2. As a result, the first low-level voltage of 0V, inputted as the input voltage (VIN), is level-shifted into the third low-level voltage of −10V.

When a first high-level voltage of 5V is inputted as an input voltage VIN, the first NMOS transistor MNT1 is turned on and charges a first low-level voltage of −4V, supplied from the third power supply VSS2, into the first node N1. The first low-level voltage of −4V, charged into the first node N1, allows the second and fourth PMOS transistors MPT2 and MPT4 to be turned on to charge a second high-level voltage of 10V, supplied from the first power supply VDD, into the second and fourth nodes N2 and N4. The second high-level voltage of 10V charged at the second node N2 allows the third PMOS transistor MPT3 to be turned off while the second high-level voltage of 10V charged in the fourth node N4 allows the third NMOS transistor MNT3 to be turned on. Accordingly, a second low-level voltage of −10V is applied to the third node N3 to turn off the fourth NMOS transistor MNT4. Thus, the second high-level voltage of 10V, charged into the fourth node N4, is applied as the output voltage VOUT via the first and second inverters INV1 and INV2. As a result, the first high-level voltage of 5V, inputted as an input voltage VIN, is level-shifted into the second high-level voltage of 10V.

Referring to FIG. 3, the level shifter circuit level-shifts an inputted voltage VIN having a swing width of 0V~5V into an output voltage VOUT having a swing width of −10V~10V and outputs the output voltage VOUT. Use of the level shifter circuit shown in FIG. 3, however, is disadvantageous in that a third power supply (i.e., VSS2) is required whereas other level shifter circuits do not require any such third power supply. Further, the MOS transistors MNT and MPT in the level shifter shown in FIG. 3 are made of polycrystalline silicon. Fabricating transistors using polycrystalline silicon is difficult. Still further, when threshold voltages of various MOS transistors in a circuit become different, the level shifter circuit may not work properly. For example, as the threshold voltage of the MOS transistors MNT and MPT increases, the amount of turn-on current decreases and the output voltage VOUT is reduced.

Generally, threshold voltages of polycrystalline silicon type thin film transistors are much greater than those of amorphous silicon type thin film transistors because threshold voltages of polycrystalline silicon type TFTs are influenced by the electric charge mobility of the polycrystalline silicon material. The electric charge mobility of the polycrystalline silicon is influenced by the size of the grain boundaries produced in the TFT when polycrystalline silicon crystallizes. Typically, grain boundaries of crystallized polycrystalline silicon vary in size depending on the location on the substrate where the polycrystalline crystallizes. Accordingly, thin film transistors MNT and MPT, while concurrently fabricated on a single substrate, will have grain,boundaries of varying sizes and the threshold voltages of the various MNT and MPT TFTs will vary due to their location on the substrate where they were fabricated. Since the threshold voltages of the various MNT and MPT TFTs vary, threshold voltages of the level shifter circuits are not uniform. Level shifter circuits such as those illustrated in FIG. 3 cannot compensate for changes in the threshold voltage and the level shifter circuit deteriorates in reliability and the output voltage is reduced.

FIG. 4 illustrates a level shifter circuit capable of being built within a liquid crystal display panel employing polycrystalline silicon.

Referring to FIG. 4, the related art level shifter circuit includes a first PMOS transistor MPT1 having gate and source terminals commonly connected to the first node N1 and having a drain terminal connected to the supply line of the first power supply VDD; a first NMOS transistor MNT1 having gate and drain terminals commonly connected to the first node N1 and having a source terminal connected to the supply line of the second power supply VSS; a second PMOS transistor MPT2 having gate terminal connected to the first node N1 and connected between the supply line of the first power supply VDD and the second node N2 (i.e., the output node); a second NMOS transistor MNT2 having a gate terminal connected to the first node N1 and being connected between the second node N2 and the input line. The level shifter circuit shown in FIG. 4 further includes two inverters INV1 and INV2 connected in series with the second node N2. Inverters INV1 and INV2 are commonly connected to the first and second power supply VDD and VSS.

The first PMOS transistor MPT1 and the first NMOS transistor MNT1, connected in series between the supply line of the first power supply VDD and the supply line of the second power supply VSS, are always maintained in a turned-on state and act as a voltage distributor.

When a low-level voltage of 0V is inputted as the input voltage VIN, the second NMOS transistor MNT2 is turned on and the second PMOS transistor MPT2 is turned off. Accordingly, the low-level voltage of 0V is charged in the output node N2 and is outputted as the output voltage VOUT via the first and second inverter INV1 and INV2.

When a high-level voltage of 5V is inputted as the input voltage VIN, the second NMOS transistor MNT2 is turned off and the second PMOS transistor MPT2 is turned on. Accordingly, the high-level voltage from the first power supply VDD is charged in the output node N2 and is outputted to the output voltage VOUT via the first and second inverter INV1 and INV2.

Level shifter circuits such as those illustrated in FIG. 4 do not need any additional power supply and they require a relatively fewer number of MOS transistors as level shifter circuits such those illustrated in FIG. 3. However, the level shifting range extremely limited and the operable frequency of the level shifter drops remarkably since the low-level of the level-shifted output voltage VOUT is fixed by the low-level voltage of the input voltage VIN. Further, and for reasons explained above with reference to FIG. 3, there is no way to compensate for a change in the threshold voltage of the MOS transistors. Accordingly, the reliability of the level shifter circuit may be deteriorated such that the output voltage VOUT is reduced. Further, in level shifters such as those illustrated in FIG. 4, the first PMOS and first NMOS transistors MPT1 and MNT1 are maintained in a turned-on state at all times. Accordingly, a current path is formed between the first power supply VDD and the second power supply VSS. When the current path is so formed, power dissipation of the device becomes excessively large due to generation of a static current.

Moreover, when the first latch array 26 shown in FIG. 2 is provided at a preceding stage, the inputted pixel data are level-shifted by one bit and the number of first latch arrays required equals the total number of the bits of pixel data. Accordingly, in order to build level shifters for level-shifting pixel data in liquid crystal display panels, the number of the bits of pixel data needs to be very small. However, the number of the bits of pixel data is proportional to the number of the level shifters. As a result, the aforementioned related art level shifter cannot be practically applied to display panels capable of displaying images at with high resolution and high colorization and having a large number of pixels.

FIG. 5 illustrates a circuit with respect to a 1-bit latch included within the first latch array 26 shown in FIG. 2.

Referring to FIG. 5, the 1-bit latch includes a first PMOS transistor MPT1 and a first NMOS transistor MNT1 having gate terminals commonly connected to the supply line of the input voltage VIN and being connected between the supply line of the first power supply VDD and the supply line of the second power supply VSS; a second NMOS transistor MNT2 having a gate terminal connected to the supply line of a sampling pulse SP and also connected between the first NMOS transistor MNT1 and the supply line of the second power supply VSS; a second PMOS transistor MPT2 having a gate terminal connected to the supply line of an inverted sampling pulse SPB and also being connected between the supply line of the first power supply VDD and the first PMOS transistor MPT1; a first inverter INV1 for inverting the voltage of the first node N1, located between the first PMOS transistor MPT1 and the first NMOS transistor MNT1, and for supplying the voltage to the output voltage VOUT; and a second inverter INV2 for inverting the output voltage VOUT and returning the inverted output voltage back to the first node N1.

When a sampling pulse SP represents a high state and an inverted sampling pulse SPB represents a low state and are both outputted from the shift register 22 shown in FIG. 2, and when an input voltage VIN representing a low state is inputted, the first and second PMOS transistors MPT1 and MPT2 are turned on and the first node N1 is supplied with a high-level voltage of the first power supply VDD. Accordingly, the first inverter INV1 inverts the high-level voltage of the first node N1 and outputs the output voltage VOUT representing a low state (i.e., a low-level voltage). When the input voltage VIN representing a high state is inputted, the first and second NMOS transistors MNT1 and MNT2 are turned on so the first node N1 is supplied with a low-level voltage of the second power supply VSS. Accordingly, the first inverter INV1 inverts the low-level voltage of the first node N1 and outputs the output voltage VOUT representing a high state. Moreover, the second inverter INV2 is turned off by the sampling pulse representing a high state and the inverted sampling pulse SPB representing a low state.

When the sampling pulse SP represents a low state and the inverted sampling pulse SPB represents a high state and when both are outputted from the shift register 22 shown in FIG. 2, the second PMOS transistor MPT2 and the second NMOS transistor MNT2 are turned off while the second inverter INV2 is turned on. Accordingly, the first and second inverters INV1 and INV2 invert the voltage of the preceding state in the first node N1 regardless of the input voltage VIN and subsequently apply the inverted voltage to the output voltage VOUT. Subsequently, the output voltage VOUT is inverted and returned to the first node N1, thereby maintaining the output voltage VOUT at the preceding state.

Level shifters and latches such as those described above include a relatively large number of transistors. Accordingly, when the level shifters such as those illustrated with reference to FIG. 3 or 4 are added to the pre-stage or post-stage of latches such as those illustrated with reference to FIG. 5, the number of transistors increases along with the circuit area. Accordingly, fabricating data drivers by combining the aforementioned level shifter and latch is not practical in fabricating high resolution display panels capable of attaining high levels of colorization that require increasing bits of pixel data.

SUMMARY OF THE INVENTION

Accordingly, an advantage of the present invention provides a level shifter capable of performing a level-shifting rapidly while using a minimum number of transistors.

Another advantage of the present invention provides a level shifter that is adaptive for reducing power dissipation by lessening a static current.

Another advantage provides a level shifter capable of controlling a level-shift range.

Another advantage provides a latch incorporating a built-in level shifter capable of minimizing a circuit area.

Another advantage provides a latch incorporating a level shifter capable of being built within a high resolution display panel where high levels of colorization are attainable.

Another advantage provides a data driver of a display panel employing a latch circuit incorporating a built-in level shifter.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a level shifter for increasing a swing width of an input voltage and outputting the voltage having the increased swing width may, for example, include a controller for selectively using a first power supply or a second power supply in accordance with an inputted voltage to apply a voltage to a first node, wherein the applied voltage has a voltage level opposite a voltage level of the input voltage; and an output part for selectively using the first power supply, the second power supply, or a third power supply in accordance with the voltage at the first node to apply an output voltage, wherein the output voltage has a voltage level opposite the voltage level of the first node.

In one aspect of the present invention, the controller may, for example, include a p-type first transistor and an n-type second transistor having gate terminals that are commonly connected to the supply line of the input voltage and wherein the first and second transistors are connected in series between the supply line of the first power supply and the supply line of the second power supply; and a p-type third transistor having a gate terminal connected to the first node, a source terminal to the first transistor, and a drain terminal connected to the second transistor, wherein the gate and drain terminals are commonly connected.

In another aspect of the present invention, the output part may, for example, include a p-type fourth transistor having a gate terminal connected to the first node while also being connected between the supply line of the first power supply and the supply line of the output voltage; and an n-type fifth transistor having a gate terminal connected to the first node while also being connected between the supply line of the output voltage and the supply line of any one of the second and third power supplies.

In yet another aspect of the present invention, the level shifter may further include an inverter for inverting the voltage level of the output voltage using the first power supply and the third power supply.

In still another aspect of the present invention, the voltage of the first power supply may be greater than the voltage of the second power supply and the voltage of the second power supply may be greater than the voltage of the third power supply.

In an additional aspect of the present invention, the level shifter may be built within at least one driver, wherein the at least one driver includes a gate driver built in a display panel for driving a plurality of gate lines of the display panel and a data driver built in the display panel for driving a plurality of data lines of the display panel.

In a further aspect of the present invention, the level shifter may include a plurality of transistors made of polycrystalline silicon.

In one aspect of the present invention, latch incorporating a built-in level shifter may, for example, include a sampler for sampling an input voltage and for outputting the sampled voltage in response to externally inputted sampling and inverted sampling pulses; a level shifter for shifting the level of the sampled voltage and for outputting the level shifted sampled voltage; and a returning part for returning the voltage outputted by the level shifter to an input terminal of the level shifter, wherein the voltage outputted by the level shifter is maintained in a preceding state in response to the sampling and the inverted sampling pulses.

In another aspect of the present invention, the level shifter may, for example, include a controller for selectively using, in accordance with the sampling voltage, a first power supply or a second power supply to apply a voltage to a first node, wherein the level of the applied voltage is opposite the level of the input voltage; and an output part for selectively using the first power supply, the second power supply, or a third power supply in accordance with the voltage of the first node and for applying an output voltage having a voltage level opposite a voltage level of the first node.

In yet another aspect of the present invention, the controller may, for example, include a p-type first transistor and an n-type second transistor having gate terminals that are commonly connected to the supply line of the sampling voltage and wherein the first and second transistors are connected in series between the supply line of the first power supply and the supply line of the second power supply; and a p-type third transistor having a gate terminal connected to the first node, a source terminal to the first transistor, and a drain terminal connected to the second transistor, wherein the gate and drain terminals are commonly connected.

In still another aspect of the present invention, the output part may, for example, include a p-type fourth transistor having a gate terminal connected to the first node while also being connected between the supply line of the first power supply and the supply line of the output voltage; and an n-type fifth transistor having a gate terminal connected to the first node while also being connected between the supply line of the output voltage and the supply line of any one of the second power supply and the third power supply.

In an additional aspect of the present invention, the level shifter may further include an inverter for inverting the voltage level of the output voltage using the first power supply and the third power supply.

In one aspect of the present invention, the sampler may, for example, include a first CMOS transistor for inputting the sampling and inverted sampling pulses to its gate terminal, wherein the sampler may be connected between the supply line of the input voltage and the output line of the sampling voltage.

In another aspect of the present invention, the returning part may, for example, include a second CMOS transistor for inputting the sampling and inverted sampling pulses to its gate terminal, wherein the returning part may be connected between the output line of the level shifter and the input line of the level shifter.

In still another aspect of the present invention, one of the first and second CMOS transistors may be turned on or off while the other of the first and second CMOS transistors is turned off or on, respectively.

In yet another aspect of the present invention, the voltage of the first power supply may be greater than the voltage of the second power supply and the voltage of the second power supply may be greater than the voltage of the third power supply.

In a further aspect of the present invention, the latch incorporating the built-in level shifter may, for example, be included within a data driver built into a display panel, wherein the latch samples the input data, shifts the voltage level of the input data, and subsequently latches the level shifted input data.

In another aspect of the present invention, the latch may, for example, include a plurality of transistors made of a material including polycrystalline silicon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 6:
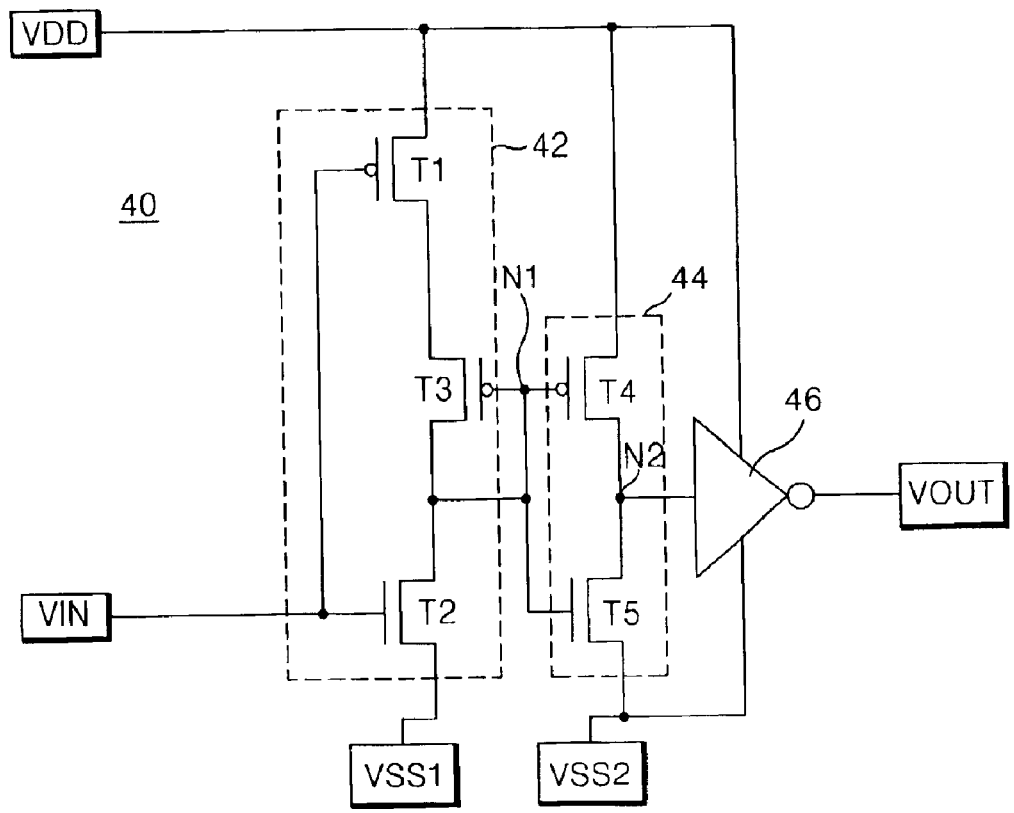
FIG. 6 illustrates a circuit diagram of a level shifter in accordance with an aspect of the present invention.

FIG. 6 illustrates a circuit diagram of a level shifter 40 in accordance with an aspect of the present invention.

Referring to FIG. 6, a level shifter 40 may, for example, include a controller 42 having first to third MOS transistors T1, T2, and T3 for controlling a first node N1 using a first power supply VDD and a second power supply VSS1 in accordance with the voltage level of an input voltage VIN; and an output part such as an inverter 44, wherein the output part includes fourth and fifth MOS transistors T4 and T5 for inverting the voltage level of the first node N1 and for outputting the inverted voltage level of the first node N1 to a second node N2. In one aspect of the present invention, a second inverter 46 may be further included to provide an output voltage VOUT having a voltage level opposite a voltage level of the input voltage VIN. Accordingly, the second inverter 46 may invert the voltage level of the second node N2 and output the inverted voltage of the second node N2 using the first power supply VDD and a third power supply VSS2.

In one aspect of the present invention, the first MOS transistor T1 may be a p-type transistor while the second MOS transistor T2 may be an n-type transistor. In another aspect of the present invention, the gate terminals of the first and second MOS transistors T1 and T2 may be commonly connected to the supply line of the input voltage VIN while also being connected between the supply line of the first power supply VDD and the supply line of the second power supply VSS1. In one aspect of the present invention, the third MOS transistor T3 may be a p-type transistor. Further, the third MOS transistor T3 may be connected between the first and second MOS transistors T1 and T2 while the gate and drain terminals of the third MOS transistor T3 are commonly connected to the first node N1. In one aspect of the present invention, the fourth MOS transistor T4 may be a p-type transistor. Further, the fourth MOS transistor T4 may be connected between the supply line of the first power supply VDD and the second node N2 and include a gate terminal connected to the first node N1. In one aspect of the present invention, the fifth MOS transistor T5 may be an n-type transistor. Further, the fifth MOS transistor T5 may be connected between the second node N2 and the supply line of the third power supply VSS2 and include a gate terminal connected to the first node N1.

In one aspect of the present invention, the first power supply VDD may apply a high-level driving voltage of at least about 5V, the second power supply VSS1 may apply a low-level driving voltage of about 0V or less, and the third power supply VSS2 may apply a low-level driving voltage lower than the driving voltage of the second power supply VSS1. Accordingly, the level shifter circuit shown in FIG. 6 may shift the voltage level of the input voltage VIN to the voltage level of either the first or third power supply VDD or VSS2, respectively, and subsequently apply the level shifted input voltage VIN as an output voltage VOUT.

An exemplary operation of the aforementioned level shifter 40 will now be described in greater detail below.

When a low-level voltage is applied as the input voltage VIN, the first MOS transistor T1, e.g., a p-type transistor, is turned on and the second MOS transistor T2, e.g., an n-type transistor, is turned off. As a result, a current from the first power supply VDD, supplied via the turned-on first MOS transistor T1, is greater than a current passing through the third MOS transistor T3, provided in a turned-on state, and the voltage of the first node N1 rises toward the voltage of the first power supply VDD. Accordingly, the fifth MOS transistor T5, e.g., an n-type transistor, is turned on to apply the low-level voltage of the third power supply VSS2 to the second node N2 as the output node. The second inverter 46 may invert the low-level voltage at the second node N2 into a high-level voltage using the first power supply VDD and apply the inverted low-level voltage at the second node N2 to the output voltage VOUT.

When a high-level voltage is applied as the input voltage VIN, the second MOS transistor T2, e.g., an n-type transistor, is turned on and the first MOS transistor T1, e.g., a p-type transistor, is turned off. As a result, a current from the second power supply VSS1, supplied via the turned-on second MOS transistor T2, is greater than a current passing through the third MOS transistor T3, provided in a turned-on state and the voltage of the first node N1 falls toward the voltage of the second power supply VSS1. Accordingly, the fourth MOS transistor T4, e.g., a p-type transistor, is turned on to apply the high-level voltage of the first power supply VDD to the second node N2 as the output node. The second inverter 46 may invert the high-level voltage at the second node N2 into a low-level voltage using the third power supply VSS2 and apply the inverted high-level voltage at the second node N2 to the output voltage VOUT.

Figure 7:
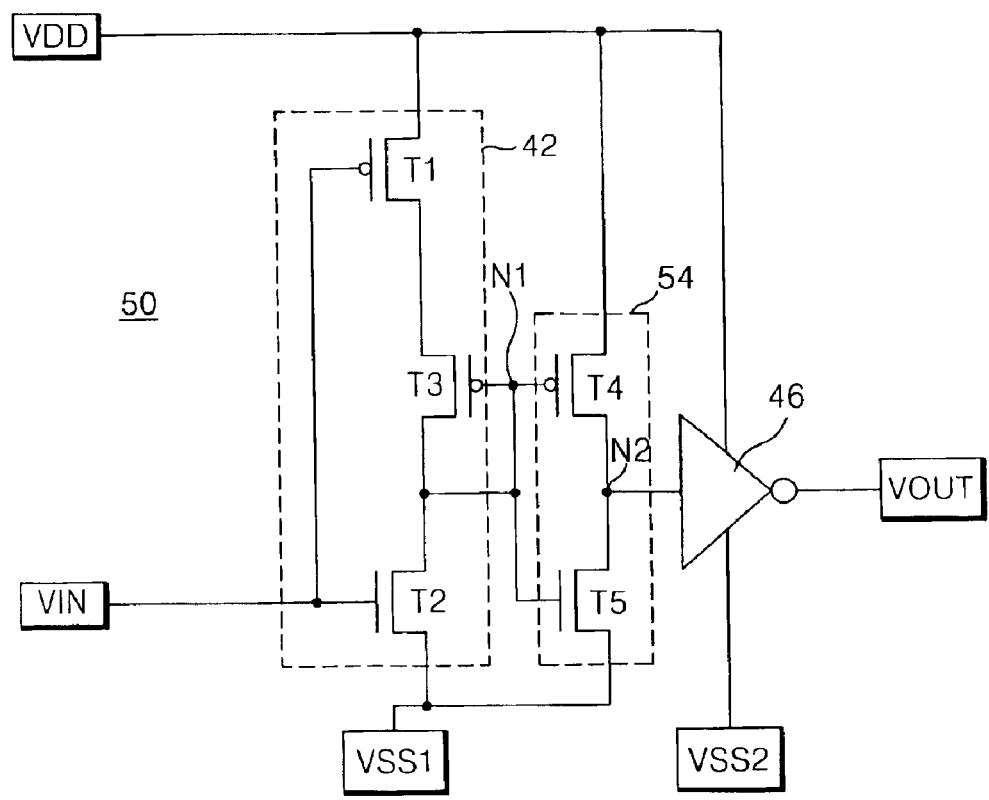
FIG. 7 illustrates a circuit diagram of a level shifter in accordance with another aspect of the present invention.

FIG. 7 illustrates a circuit diagram of a level shifter 50 in accordance with another aspect of the present invention.

Referring to FIG. 7, the level shifter 50 is similar in construction as the level shifter 40 shown in FIG. 6 except the fifth MOS transistor T5, included in inverter 54, is connected to the supply line of the second power supply VSS1. Thus for the sake of brevity, a discussion of only the unique aspects of level shifter 50 is provided below.

When a low-level voltage is applied as the input voltage VIN, the first MOS transistor T1, e.g., a p-type transistor, is turned on and the second MOS transistor T2, e.g., an n-type transistor, is turned off. As a result, a current from the first power supply VDD, supplied via the turned-on first MOS transistor T1, is greater than a current passing through the third MOS transistor T3, provided in a turned-on state and the voltage of the first node N1 rises toward the voltage of the first power supply VDD. Accordingly, the fifth MOS transistor T5, e.g., an n-type transistor, is turned on to apply the low-level voltage of the second power supply VSS1 to the second node N2 as the output node. The second inverter 46 may invert the low-level voltage at the second node N2 into a high-level voltage using the first power supply VDD and apply the inverted low-level voltage at the second node N2 to the output voltage VOUT.

When a high-level voltage is applied as the input voltage VIN, the second MOS transistor T2, e.g., an n-type transistor, is turned on and the first MOS transistor T1, e.g., a p-type transistor, is turned off. As a result, a current from the second power supply VSS1, supplied via the turned-on second MOS transistor T2, is greater than a current passing through the third MOS transistor T3, provided in a turned-on state and the voltage of the first node N1 falls toward the voltage of the second power supply VSS1. Accordingly, the fourth MOS transistor T4, e.g., a p-type transistor, is turned on to apply the high-level voltage of the first power supply VDD to the second node N2 as the output node. The second inverter 46 may invert the high-level voltage at the second node N2 into a low-level voltage using the third power supply VSS2 and apply the inverted high-level voltage at the second node N2 to the output voltage VOUT.

Figure 1:
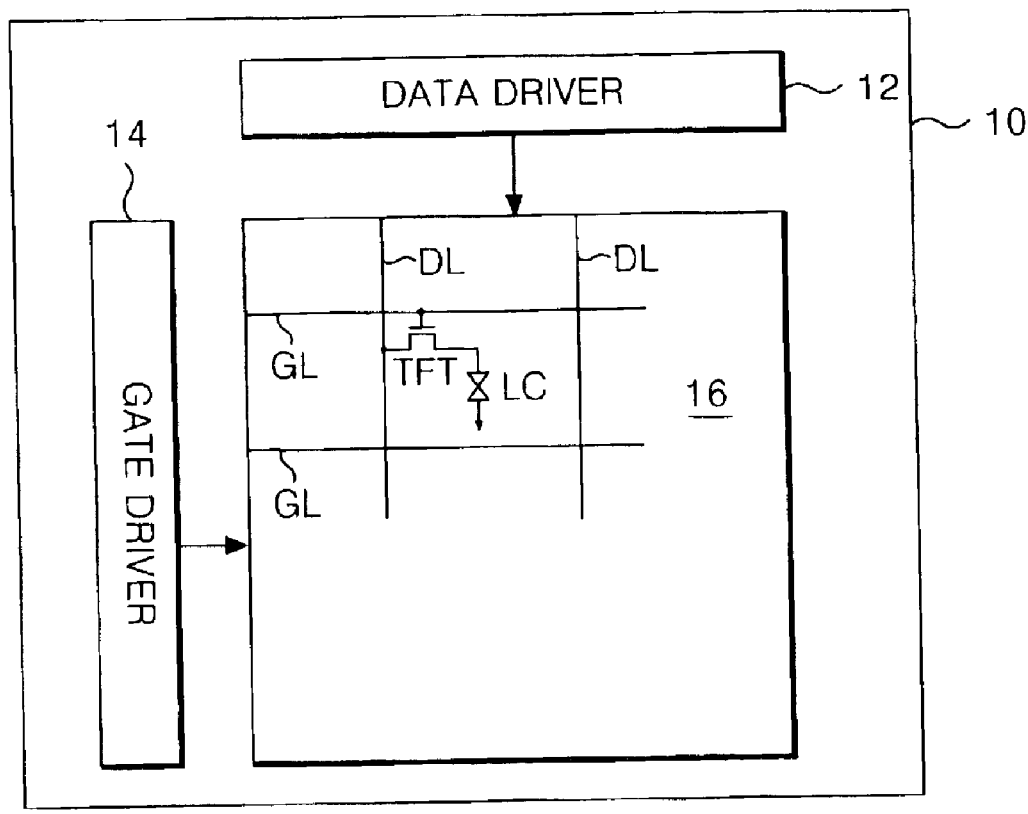
FIG. 1 illustrates a schematic diagram of a related art polycrystalline silicon type liquid crystal display panel.
Figure 2:
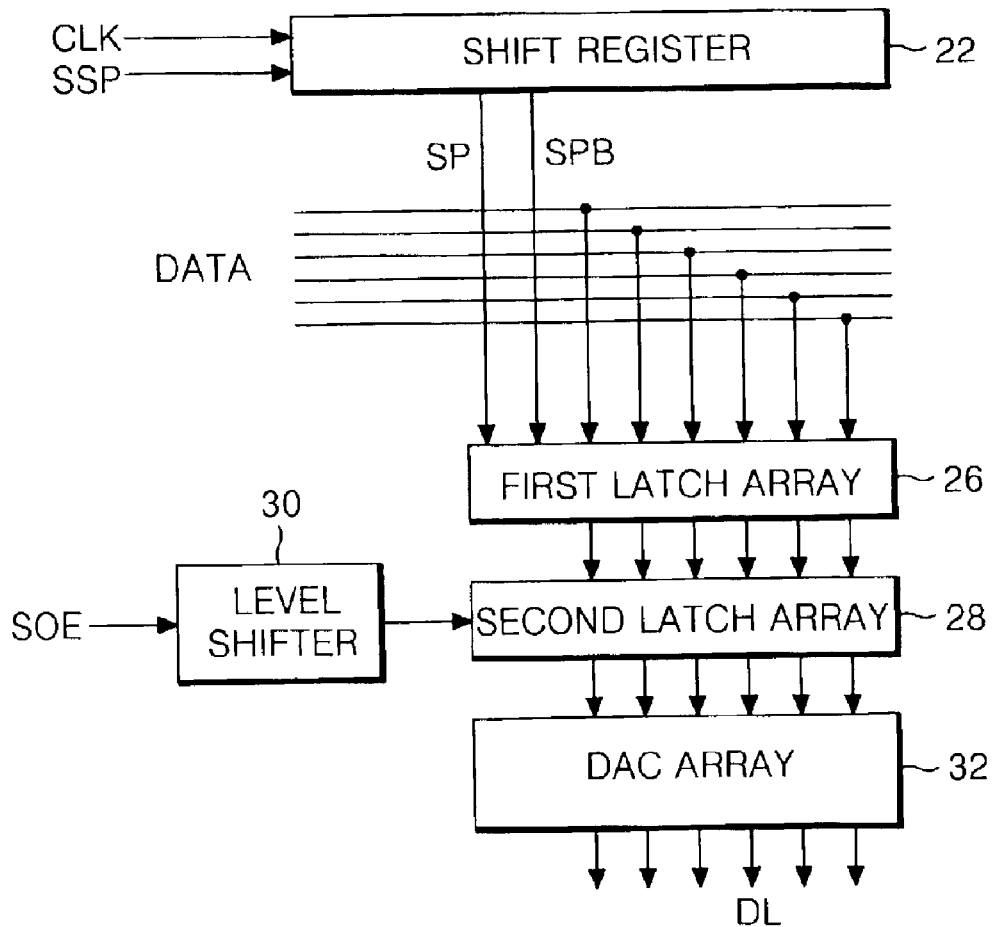
FIG. 2 illustrates an internal schematic diagram of the data driver shown in FIG. 1.
Figure 3:
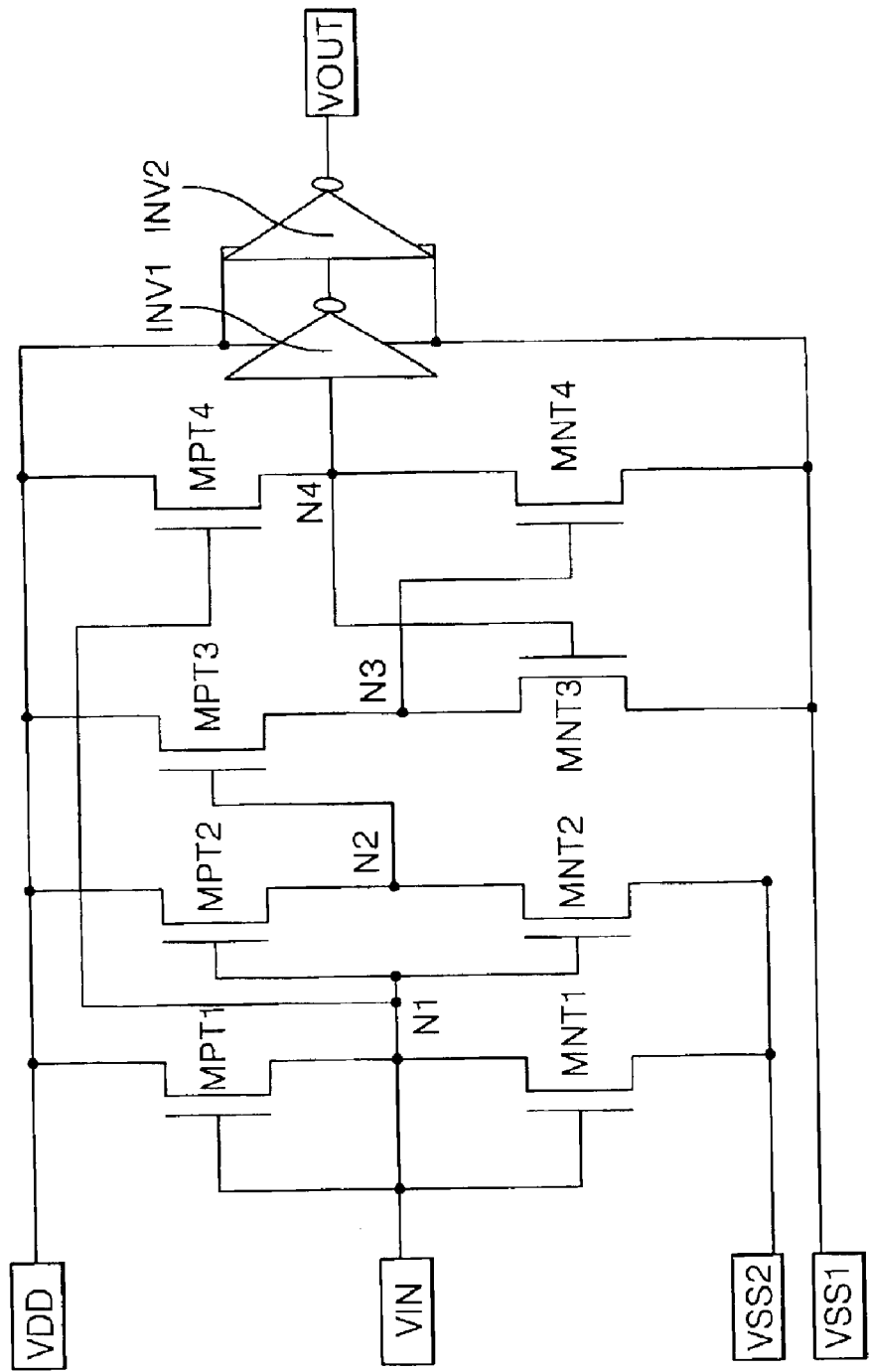
FIG. 3 illustrates a circuit diagram of a related art level shifter.
Figure 4:
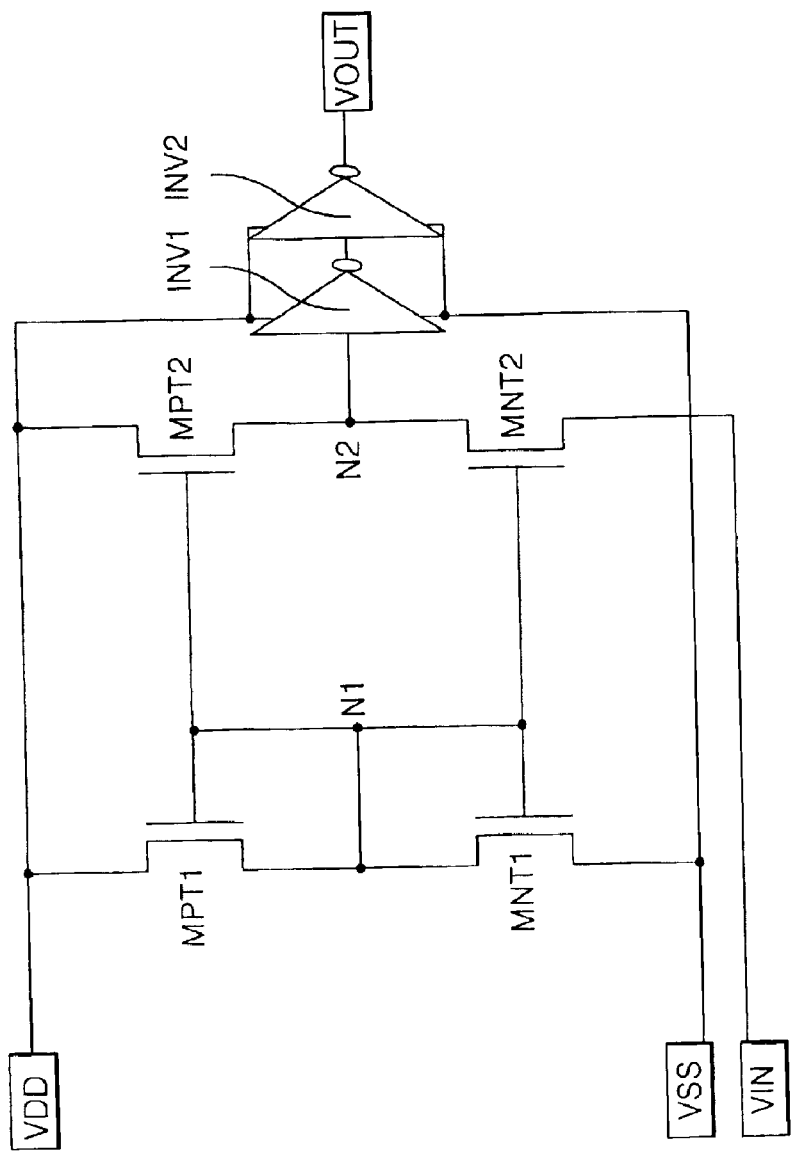
FIG. 4 illustrates a circuit diagram of another related art level shifter.
Figure 5:
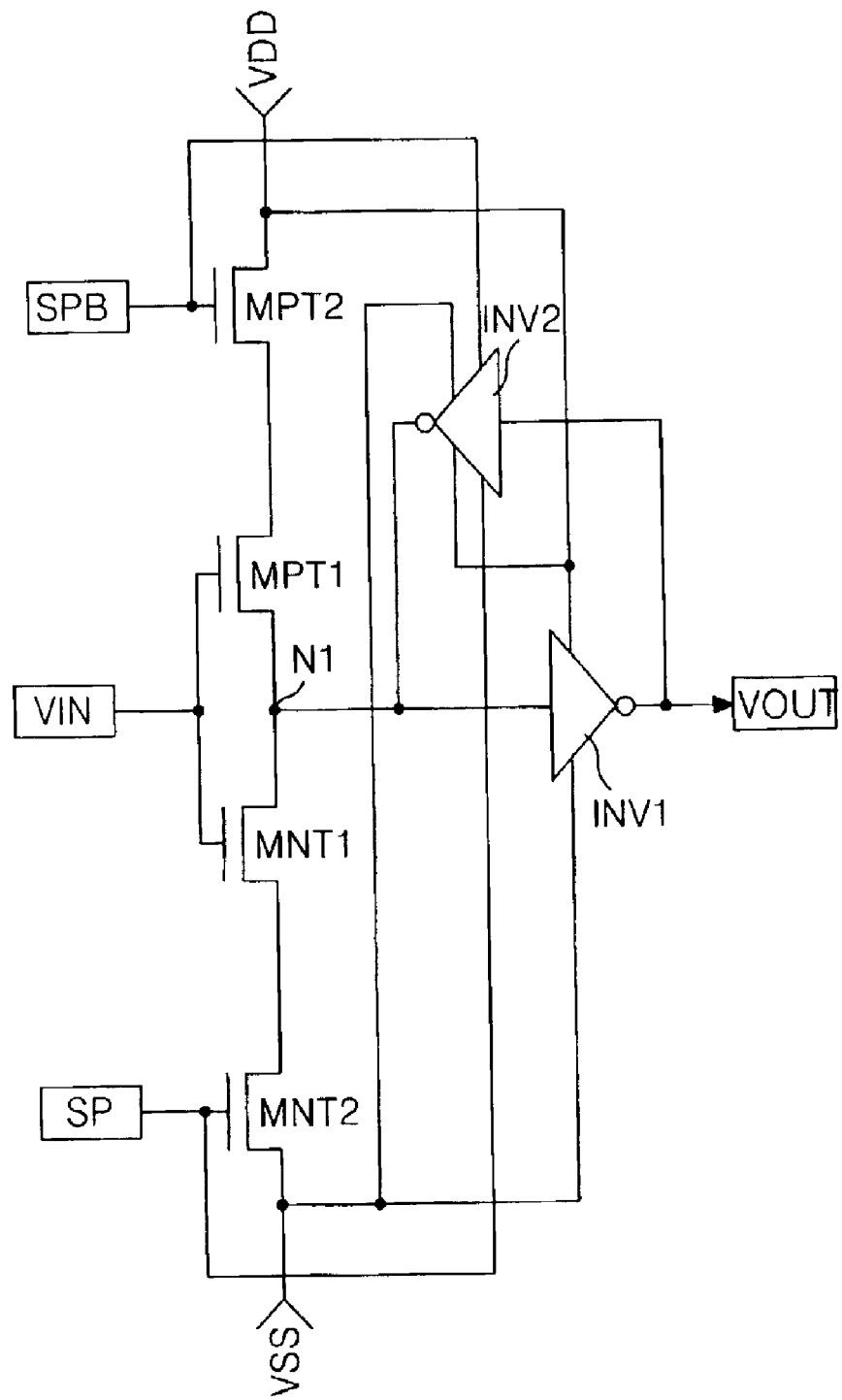
FIG. 5 illustrates a circuit diagram of a latch included within a first latch array shown in FIG. 2.

The level shifter according to the present invention can perform level-shifting operations accurately and at a rapid speed in accordance with the input voltage VIN even though fewer transistors are employed as compared with level shifters of the related art. Contrary to level shifters such as those illustrated in FIG. 4, a current path is not formed within the level shifter according to the present invention. Accordingly, the level shifter according to the present invention has low static current characteristics to reduce power dissipation.

In accordance with the principles of the present invention, the swing width of the level shifter can be adjusted by controlling the voltage value of the third power supply VSS2. Accordingly, a level-shifting range may be adjusted as required and the operational margin, correction capacity, and reliability may all be improved.

In one aspect of the present invention, the level shifter may be used as a gate driver and as a data driver of display panels (e.g., EL display devices, liquid crystal display devices, etc.) Employing built-in driving circuits.

Figure 8:
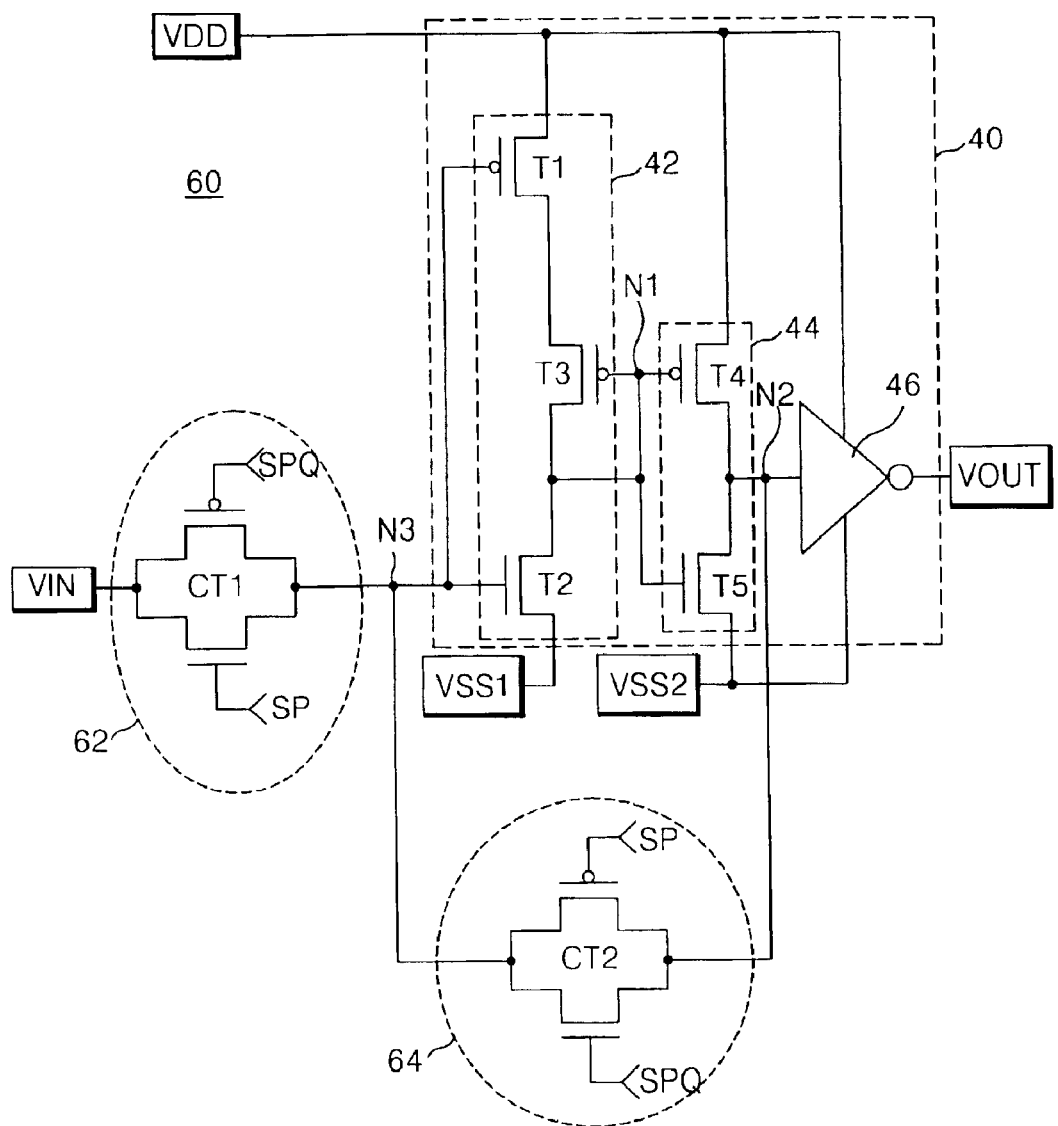
FIG. 8 illustrates a circuit diagram of a latch incorporating a built-in level shifter in accordance with yet another aspect of the present invention.

FIG. 8 illustrates a circuit diagram of a latch 60 incorporating a built-in level shifter in accordance with yet another aspect of the present invention.

Referring to FIG. 8, latch 60 incorporating a built-in level shifter may, for example, include a sampler 62 for sampling an input voltage VIN in accordance with a sampling pulse SP and for applying the sampled input voltage VIN to a third node N3; a level shifter 40 for shifting the voltage level of the voltage applied to a third node N3 and for outputting the level shifted voltage; a returning part 64 for returning the voltage outputted by the level shifter 40 to the third node N3 in accordance with the sampling pulse SP such that a previous voltage level of the level shifter 40 is maintained.

In one aspect of the present invention, the sampler 62 may include a first CMOS transistor CT1 connected between the supply line of the input voltage VIN and the third node N3 and input a sampling pulse SP and an inverted sampling pulse SPQ from a shift register (not shown) to a gate terminal. Accordingly, the sampling pulse SP and the inverted sampling pulse SPQ may control the n-type MOS transistor and the p-type MOS transistor, respectively, of the first CMOS transistor CT1.

In one aspect of the present invention, the returning part 64 may include a second CMOS transistor CT2 connected between the second node N2 and the third node N3 and input the sampling pulse SP and the inverted sampling pulse SPQ to a gate terminal. Accordingly, the inverted sampling pulse SPQ and the sampling pulse SP may control the n-type MOS transistor and the p-type MOS transistor, respectively, of the second CMOS transistor CT2.

Referring back to FIG. 6, the level shifter 40 may, for example, include a controller 42 having first to third MOS transistor T1, T2, and T3 for controlling a first node N1 using a first power supply VDD and a second power supply VSS1 in accordance with the voltage level of the third node N3; and an output part such as an inverter 44, wherein the output part includes fourth and fifth MOS transistors T4 and T5 for inverting the voltage level of the first node N1 and for outputting the inverted voltage level of the first node N1 to the second node N2. In one aspect of the present invention, a second inverter 46 may be further included to provide an output voltage VOUT having a voltage level opposite a voltage level of the input voltage VIN. Accordingly, the second inverter 46 may invert the voltage level of the second node N2 and outputs the inverted voltage of the second node N2 using the first power supply VDD and the third power supply VSS2.

In the level shifter 40 of the present invention, the first MOS transistor T1 may be a p-type transistor while the second MOS transistor T2 may be an n-type transistor. In one aspect of the present invention, the gate terminals of the first and second MOS transistors T1 and T2 may be commonly connected to the supply line of the input voltage VIN while also being connected between the supply line of the first power supply VDD and the supply line of the second power supply VSS1. In one aspect of the present invention, the third MOS transistor T3 may be a p-type transistor. Further, the third MOS transistor T3 may be connected between the first and second MOS transistors T1 and T2 while the gate drain terminals of the third MOS transistor T3 are commonly connected to the first node N1. In one aspect of the present invention, the fourth MOS transistor T4 may be a p-type transistor. Further, the fourth MOS transistor T4 may be connected between the supply line of the first power supply VDD and the second node N2 and include a gate terminal connected to the first node N1. In one aspect of the present invention, the fifth MOS transistor T5 may be an n-type transistor. Further, the fifth MOS transistor T5 may connected between the second node N2 and the supply line of the third power supply VSS2 and include a gate terminal connected to the first node N1.

In one aspect of the present invention, the first power supply VDD may apply a high-level driving voltage of at least about 5V, the second power supply VSS1 may apply a low-level driving voltage of 0V or less, and the third power supply VSS2 may apply a low-level driving voltage lower than the driving voltage of the second power supply VSS1. Accordingly, the latch incorporating a built-in level shifter may shift the voltage level of the input voltage VIN to the voltage level of either the first or third power supply VDD or VSS2, respectively, latch the level shifted voltage, and subsequently apply the latched voltage as the output voltage VOUT.

An exemplary operation of the aforementioned latch 60 incorporating the built-in level shifter will now be described in greater detail below.

When a sampling pulse SP having a high-level voltage and an inverted sampling pulse SPQ having a low-level voltage are outputted by the shift register (not shown), the first CMOS transistor CT1 is turned on and applies the input voltage VIN to the third node N3. Accordingly, the returning part 64 is turned off because the returning part 64 is operated oppositely from the sampler 62.

When the input voltage VIN sampled by the turned-on first CMOS transistor CT1 is a low-level voltage, the first MOS transistor T1, e.g., a p-type transistor, is turned on and the second MOS transistor T2, e.g., an n-type transistor, is turned off in the level shifter 40. As a result, a current from the first power supply VDD, supplied via the turned-on first MOS transistor T1, is greater than a current passing through the third MOS transistor T3, provided in a turned-on state, and the voltage of the first node N1 rises toward the voltage of the first power supply VDD. Accordingly, the fifth MOS transistor T5, e.g., an n-type transistor, is turned on to apply the low-level voltage of the third power supply VSS2 to the second node N2 as the output node. The second inverter 46 may invert the low-level voltage at the second node N2 into a high-level using the first power supply VDD and apply the inverted low-level voltage at the second node N2 to the output voltage VOUT.

When the input voltage VIN sampled by the turned-on first CMOS transistor CT1 is a high-level voltage, the second MOS transistor T2, e.g., an n-type transistor, is turned on and the first MOS transistor T1, e.g., a p-type transistor, is turned off. As a result, a current from the second power supply VSS1, supplied via the turned-on second MOS transistor T2, is greater than a current passing through the third MOS transistor T3, provided in a turned-on state, and the voltage of the first node N1 falls toward the voltage of the second power supply VSS1. Accordingly, the fourth MOS transistor T4, e.g., a p-type transistor, is turned on to apply the high-level voltage of the first power supply VDD to the second node N2 as the output node. The second inverter 46 may invert the high-level voltage at the second node N2 into a low-level using the third power supply VSS2 and apply the inverted high-level voltage at the second node N2 to the output voltage VOUT.

When a sampling pulse SP having a low-level voltage and the inverted sampling pulse SPQ having a high-level voltage are outputted by the shift register (not shown), the first CMOS transistor CT1 of the sampler 62 is turned off while the second CMOS transistor CT2 of the returning part 64 is turned on. Accordingly, the voltage of the second node N2 of the level shifter 40 is a low-level voltage and is applied to the third node N3 via the turned-on second CMOS transistor CT2. Further, the first MOS transistor T1, turned on by the low-level voltage at the third node N3, and the third MOS transistor T3, provided in a turned-on state, cause the voltage at the first node N1 to rise toward the first power supply VDD. As a result, the voltage of the second node N2 is maintained as the low-level voltage while the voltage of the sampling pulse SP is a low-level voltage because the fifth MOS transistor T5 is turned on and applies the low-level voltage of the third power supply VSS2 to the second node N2. Further, the output voltage VOUT of the inverter 46 is maintained as the high-level voltage, opposite the low-level voltage of the second node N2.

High-level voltages at the second node N2 of the level shifter 40 are applied to the third node N3 via the turned-on second CMOS transistor CT2. Further, the second MOS transistor T2, turned on by the high-level voltage at the third node N3, and the third MOS transistor T3, provided in a turned-on state, cause the voltage at the first node N1 to fall toward the second power supply VSS1. As a result, the voltage at the second node N2 is maintained as the high-level voltage while the voltage of the sampling pulse SP is a low-level voltage because the fourth MOS transistor T4 is turned on and applies the high-level voltage of the first power supply VDD to the second node N2. Further, the output voltage VOUT of the inverter 46 is maintained as the low-level voltage, opposite the high-level voltage of the second node N2.

Figure 9:
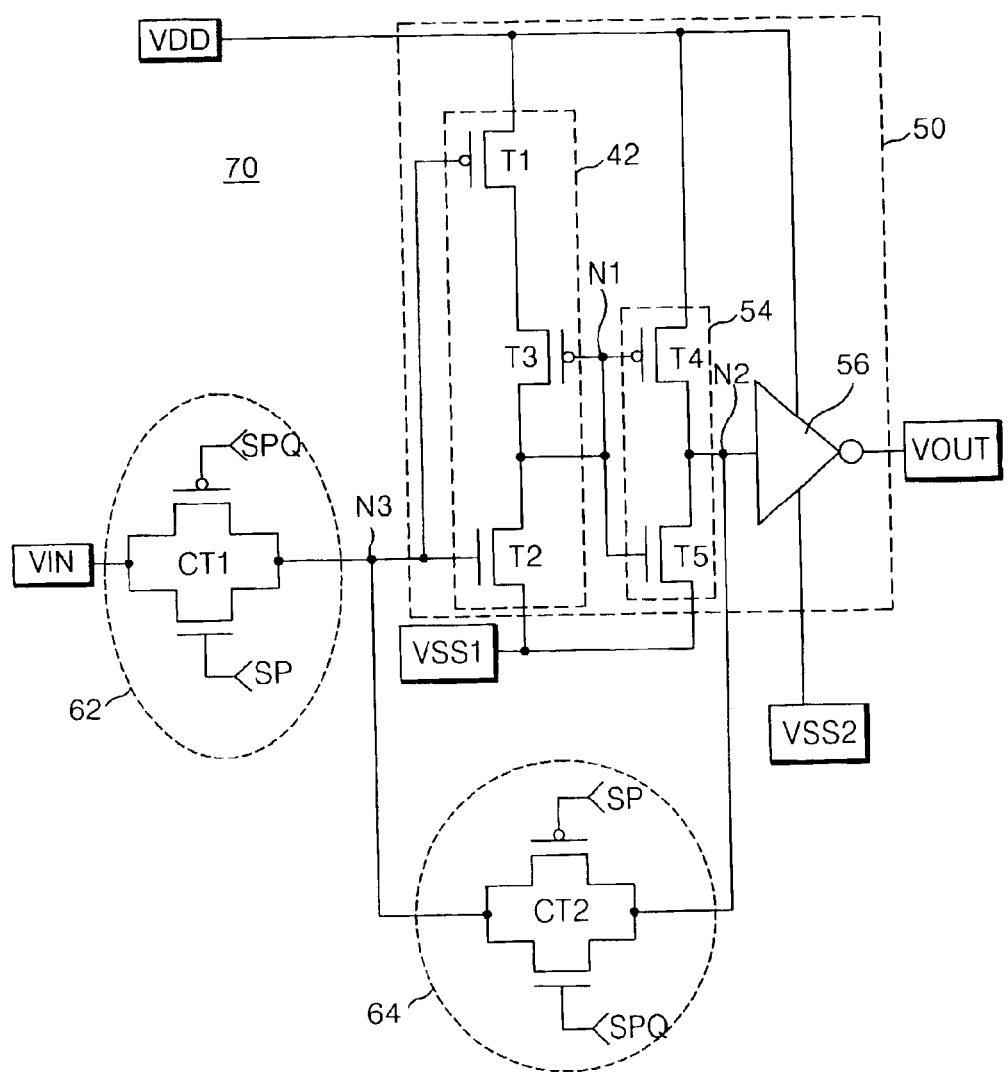
FIG. 9 illustrates a circuit diagram of a latch incorporating a built-in level shifter in accordance with still another aspect of the present invention.

FIG. 9 illustrates a circuit diagram of a latch 70 incorporating a built-in level shifter in accordance with still another aspect of the present invention.

Referring to FIG. 9, the latch 70 incorporating a built-in level shifter may, for example, be of a similar construction as the latch 60 incorporating the built-in level shifter shown in FIG. 8 except the fifth MOS transistor T5, included in inverter 54 of a level shifter 50, is connected to the supply line of the second power supply VSS1. Thus for the sake of brevity, a discussion of only the unique aspects of latch 70 is provided below.

When a sampling pulse SP having a high-level voltage and an inverted sampling pulse SPQ having a low-level voltage are outputted from the shift register (not shown), the first CMOS transistor CT1 is turned on and applies the input voltage VIN to the third node N3. Accordingly, the returning part 64 is turned off because it is operated oppositely from the sampler 62.

When the input voltage VIN sampled by the turned-on first CMOS transistor CT1 is a low-level voltage, the first MOS transistor T1, e.g., a p-type transistor, is turned on and the second MOS transistor T2, e.g., an n-type transistor, is turned off in the level shifter 40. As a result, a current from the first power supply VDD, supplied via the turned-on first MOS transistor T1, is greater than a current passing through the third MOS transistor T3, provided in a turned-on state, and the voltage of the first node N1 rises toward the voltage of the first power supply VDD. Accordingly, the fifth MOS transistor T5, e.g., an n-type transistor, is turned on to apply the low-level voltage of the second power supply VSS1 to the second node as the output node. The second inverter 56 may invert the low-level voltage at the second node N2 into a high-level voltage using the first power supply VDD and apply the inverted low-level voltage at the second node N2 to the output voltage VOUT.

When the input voltage VIN sampled by the turned-on first CMOS transistor CT1 is a high-level voltage, the second MOS transistor T2, e.g., an n-type transistor, is turned on and the first MOS transistor T1, e.g., a p-type transistor, is turned off. As a result, a current from the second power supply VSS1, supplied via the turned-on second MOS transistor T2, is greater than a current passing through the third MOS transistor T3, provided in a turned-on state, and the voltage of the first node N1 falls toward the second power supply VSS1. Accordingly, the fourth MOS transistor T4, e.g., a p-type transistor, is turned on to apply the high-level voltage of the first power supply VDD to the second node N2 as the output node. The second inverter 56 may invert the high-level voltage from the second node N2 into a low-level voltage using the third power supply VSS2 and apply the inverted high-level voltage to the output voltage VOUT.

When a sampling pulse SP having a low-level voltage and the inverted sampling pulse SPQ having a high-level voltage are outputted by the shift register (not shown), the first CMOS transistor CT1 of the sampler 62 is turned off while the second CMOS transistor CT2 of the returning part 64 is turned on. Accordingly, the voltage of the second node N2 of the level shifter 40 is a low-level voltage and is applied to the third node N3 via the turned-on second CMOS transistor CT2. Further, the first MOS transistor T1, turned on by the low-level voltage at the third node N3, and the third MOS transistor T3, provided in a turned-on state, cause the voltage at the first node N1 to rise toward the first power supply VDD. As a result, the voltage of the second node N2 is maintained as the low-level voltage while the voltage of the sampling pulse SP is a low-level voltage because the fifth MOS transistor T5 is turned on and applies the low-level voltage of the second power supply VSS1 to the second node N2. Further, the output voltage VOUT of the inverter 46 is maintained as the previous high-level voltage, opposite the low-level voltage of the second node N2.

High-level voltages at the second node N2 of the level shifter 40 are applied to the third node N3 via the turned-on second CMOS transistor CT2. Further, the second MOS transistor T2, turned on by the high-level voltage at the third node N3, and the third MOS transistor T3, provided in a turned-on state, cause the voltage at the first node N1 to fall toward the second power supply VSS1. As a result, the voltage at the second node N2 is maintained as the high-level voltage while the voltage of the sampling pulse SP is a low-level voltage because the fourth MOS transistor T4 is turned on and applies the high-level voltage of the first power supply VDD to the second node N2. Further, the output voltage VOUT of the inverter 46 is maintained as the low-level voltage, opposite the high-level voltage of the second node N2.

The latch incorporating the built-in level shifter according to the present invention samples the input voltage VIN in accordance with a sampling pulse SP using level shifter 40 or 50, illustrated in FIG. 6 or 7, respectively, then shifts the level of the input voltage, and then latches the level-shifted input voltage. Accordingly, the latches 60 and 70 incorporating the built-in level shifter can perform level shifting and latching operations accurately and at a rapid speed using a minimum number of transistors. Further, the latch according to the present invention incorporates a built-in level shifter and has a reduced circuit area.

In one aspect of the present invention, the latch may be applied to a data driver of high resolution display panel display panels (e.g., EL display devices, liquid crystal display devices, etc.) Employing built-in driving circuits and capable of attaining high levels of colorization.

According to the principles of the present invention, the level shifter can perform level-shifting operations accurately and at a rapid speed in accordance with the input voltage VIN even though fewer transistors are employed as compared with level shifters of the related art. Contrary to level shifters such as those illustrated in FIG. 4, a current path is not formed within the level shifter according to the present invention. Accordingly, the level shifter according to the present invention has low static current characteristics to reduce power dissipation. Furthermore, the swing width of the level shifter can be adjusted by controlling the voltage value of the third power supply VSS2 which determines the low-level of the output voltage. Accordingly, a level-shifting range may be adjusted as required and the operational margin, correction capacity, and reliability may all be improved. Still further, the level shifter may be used as a gate driver and as a data driver of display panels (e.g., EL display devices, liquid crystal display devices, etc.) Employing built-in driving circuits.

According to the principles of the present invention, the latch incorporating the built-in level shifter may shift a voltage level of a sampled input voltage using the aforementioned level shifter and latches the level shifted voltage to simultaneously perform accurate level shifting and latching operations rapidly operational speed using a minimum number of transistors. Further, the latch according to the present invention incorporates a built-in level shifter and has a reduced circuit area. Still further, the latch may be applied to a data driver of high resolution display panel display panels (e.g., EL display devices, liquid crystal display devices, etc.) Employing built-in driving circuits and capable of attaining high levels of colorization.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A level shifter, comprising:

a controller for using a first power supply or a second power supply in accordance with an input voltage to apply a voltage to a first node, wherein a voltage level of the applied voltage is opposite a voltage level of the input voltage;

an output part for using one of a first pair of power supplies or a second pair of power supplies in accordance with the voltage applied to the first node to apply an output voltage, wherein a voltage level of the output voltage at a second node is opposite the voltage level of the voltage applied to the first node, wherein the first pair of power supplies includes the first power supply and a third power supply, and wherein the second pair of power supplies includes the first power supply and the second power supply; and an inverter directly connected to the second node, wherein the inverter inverts a voltage level of the output voltage and outputs the inverted output voltage using the first power supply and the third power supply.

2. The level shifter according to claim 1, wherein the controller comprises:

a p-type first transistor and an n-type second transistor including gate terminals commonly connected to a supply line of the input voltage, wherein the first and second transistors are connected in series between a supply line of the first power supply and a supply line of the second power supply; and a p-type third transistor including a gate terminal connected to the first node, a source terminal connected to the first transistor, and a drain terminal connected to the second transistor, wherein the gate terminal and the drain terminal are commonly connected.

3. The level shifter according to claim 2, wherein the level shifter is included within at least one of a gate driver and a data driver included within a display panel, wherein the gate driver is provided for driving a plurality of gate lines of the display panel and the data driver is provided for driving a plurality of data lines of the display panel.

4. The level shifter according to claim 2, wherein the output part comprises:

a p-type fourth transistor including a gate terminal connected to the first node, wherein the fourth transistor is connected between the supply line of the first power supply and a supply line of the output voltage; and an n-type fifth transistor including a gate terminal connected to the first node, wherein the fifth transistor is connected between the supply line of the output voltage and a supply line of any one of the second or third power supplies.

5. The level shifter according to claim 4, wherein the level shifter is included within at least one of a gate driver and a data driver included within a display panel, wherein the gate driver is provided for driving a plurality of gate lines of the display panel and the data driver is provided for driving a plurality of data lines of the display panel.

6. The level shifter according to claim 1, wherein the level shifter is included within at least one of a gate driver and a data driver included within a display panel, wherein the gate driver is provided for driving a plurality of gate lines of the display panel and the data driver is provided for driving a plurality of data lines of the display panel.

7. The level shifter according to claim 1, wherein a voltage level of the first power supply is greater than a voltage level of the second power supply and a voltage level of the second power supply is greater than a voltage level of the third power supply.

8. The level shifter according to claim 7, wherein the level shifter is included within at least one of a gate driver and a data driver included within a display panel, wherein the gate driver is provided for driving a plurality of gate lines of the display panel and the data driver is provided for driving a plurality of data lines of the display panel.

9. The level shifter according to claim 1, wherein the level shifter comprises a plurality of transistors formed of polycrystalline silicon.

10. A latch incorporating a built-in level shifter, comprising:

a sampler for sampling an input voltage and for outputting the sampled input voltage in response to a sampling pulse and an inverted sampling pulse, wherein the sampling pulse and the inverted sampling pulse are externally inputted to the latch;

a level shifter for shifting a voltage level of the sampled input voltage applied from the sampler and for outputting the level shifted voltage; and a returning part for returning the voltage outputted by the level shifter to an input terminal of the level shifter and for maintaining outputted voltage at a previous state in response to the sampling pulse and the inverted sampling pulse.

11. The latch according to claim 10, wherein the level shifter comprises:

a controller for using a first power supply or a second power supply in accordance with the sampled input voltage to apply a voltage to a first node, wherein a voltage level of the voltage applied to the first node is opposite a voltage level of the input voltage; and an output part for using the first power supply, the second power supply, or a third power supply in accordance with the voltage applied to the first node to apply an output voltage, wherein a voltage level of the output voltage is opposite the voltage level of the voltage applied to the first node.

12. The latch according to claim 11, wherein the latch incorporating the built-in level shifter is included within a data driver included within a display panel, wherein the latch samples input data, shifts a level of the sampled input data, and latches the level shifted data.

13. The latch according to claim 11, wherein a voltage level of the first power supply is greater than a voltage level of the second power supply and a voltage level of the second power supply is greater than a voltage level of the third power supply.

14. The latch according to claim 13, wherein the latch incorporating the built-in level shifter is included within a data driver included within a display panel, wherein the latch samples input data, shifts a level of the sampled input data, and latches the level shifted data.

15. The latch according to claim 11, wherein the controller comprises:

a p-type first transistor and an n-type second transistor including gate terminals commonly connected to a supply line of the sampling voltage, wherein the first and second transistors are connected in series between a supply line of the first power supply and a supply line of the second power supply; and a p-type third transistor including a gate terminal connected to the first node, a source terminal connected to the first transistor, and a drain terminal connected to the second transistor, wherein the gate terminal and the drain terminal are commonly connected.

16. The latch according to claim 15, wherein the output part comprises:
- a p-type fourth transistor having a gate terminal connected to the first node, wherein the fourth transistor is connected between the supply line of the first power supply and a supply line of the output voltage; and
- an n-type fifth transistor including a gate terminal connected to the first node, wherein the fifth transistor is connected between the supply line of the output voltage and a supply line of any one of the second or third power supplies.

17. The latch according to claim 16, wherein the latch incorporating the built-in level shifter is included within a data driver included within a display panel, wherein the latch samples input data, shifts a level of the sampled input data, and latches the level shifted data.

18. The latch according to claim 15, wherein the latch incorporating the built-in level shifter is included within a data driver included within a display panel, wherein the latch samples input data, shifts a level of the sampled input data, and latches the level shifted data.

19. The latch according to claim 10, wherein the level shifter further comprises an inverter for inverting a voltage level of the output voltage and for outputting the inverted output voltage using the first power supply and the third power supply.

20. The latch according to claim 19, wherein the latch incorporating the built-in level shifter is included within a data driver included within a display panel, wherein the latch samples input data, shifts a level of the sampled input data, and latches the level shifted data.

21. The latch according to claim 10, wherein the sampler comprises a first CMOS transistor connected between a supply line of the input voltage and an output line of the sampled input voltage, wherein the first CMOS transistor includes a gate terminal for receiving the sampling pulse and the inverted sampling pulse.

22. The latch according to claim 21, wherein the latch incorporating the built-in level shifter is included within a data driver included within a display panel, wherein the latch samples input data, shifts a level of the sampled input data, and latches the level shifted data.

23. The latch according to claim 21, wherein the returning part comprises a second CMOS transistor connected between an output line of the level shifter and an input line of the level shifter, wherein the second CMOS transistor includes a gate terminal for receiving the sampling pulse and the inverted sampling pulse.

24. The latch according to claim 23, wherein the latch incorporating the built-in level shifter is included within a data driver included within a display panel, wherein the latch samples input data, shifts a level of the sampled input data, and latches the level shifted data.

25. The latch according to claim 23, wherein the first CMOS transistor is turned on when the second CMOS transistor is turned off and wherein the first CMOS transistor is turned off when the second CMOS transistor is turned on.

26. The latch according to claim 25, wherein the latch incorporating the built-in level shifter is included within a data driver included within a display panel, wherein the latch samples input data, shifts a level of the sampled input data, and latches the level shifted data.

27. The latch according to claim 10, wherein the latch incorporating the built-in level shifter is included within a data driver included within a display panel, wherein the latch samples input data, shifts a level of the sampled input data, and latches the level shifted data.

28. The latch according to claim 10, wherein the latch comprises a plurality of transistors formed of polycrystalline silicon.

* * * * *